(12) United States Patent
Iwamatsu

(10) Patent No.: US 8,164,388 B2
(45) Date of Patent: Apr. 24, 2012

(54) AMPLIFYING APPARATUS

(75) Inventor: Masayuki Iwamatsu, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 38 days.

(21) Appl. No.: 12/807,862

(22) Filed: Sep. 15, 2010

(65) Prior Publication Data

US 2011/0068872 A1 Mar. 24, 2011

(30) Foreign Application Priority Data

Sep. 18, 2009 (JP) ................................. 2009-216337

(51) Int. Cl.
*H03F 3/04* (2006.01)
(52) U.S. Cl. ....................................... 330/297; 330/251
(58) Field of Classification Search .................. 330/297, 330/285, 296, 207 A, 251
See application file for complete search history.

(56) References Cited

U.S. PATENT DOCUMENTS

| | | | |
|---|---|---|---|
| 4,115,739 A * | 9/1978 | Sano et al. ..................... 330/263 |
| 6,160,455 A * | 12/2000 | French et al. .................. 330/297 |
| 6,775,524 B2 | 8/2004 | Takeyabu et al. | |
| 7,701,294 B1 * | 4/2010 | Yun ................................ 330/297 |
| 7,741,914 B1 * | 6/2010 | Nabicht ......................... 330/297 |
| 7,847,637 B2 * | 12/2010 | Metzger et al. ................ 330/297 |
| 8,008,975 B1 * | 8/2011 | Allen et al. .................... 330/297 |

FOREIGN PATENT DOCUMENTS

WO    PCT/JP1999/02674    11/2000

* cited by examiner

*Primary Examiner* — Henry Choe
(74) *Attorney, Agent, or Firm* — Pillsbury Winthrop Shaw Pittman LLP

(57) ABSTRACT

An amplifying apparatus amplifies an input signal supplied to an input terminal and outputs an output signal from an output terminal. The apparatus includes a high-potential power supply line through which a high voltage is supplied; a low-potential power supply line through which a low voltage is supplied; a control unit; and a power supply in which one of the high and low voltages is a fixed voltage, and which generates, as the other of the high and low voltages, one of a first voltage in which a polarity of the fixed voltage is inverted, and a second voltage which is closer to the ground potential than the first voltage is. The control unit controls the power supply to cause the other of the high and low voltages to be switched between the first voltage and the second voltage in accordance with a signal level of the output signal.

5 Claims, 9 Drawing Sheets

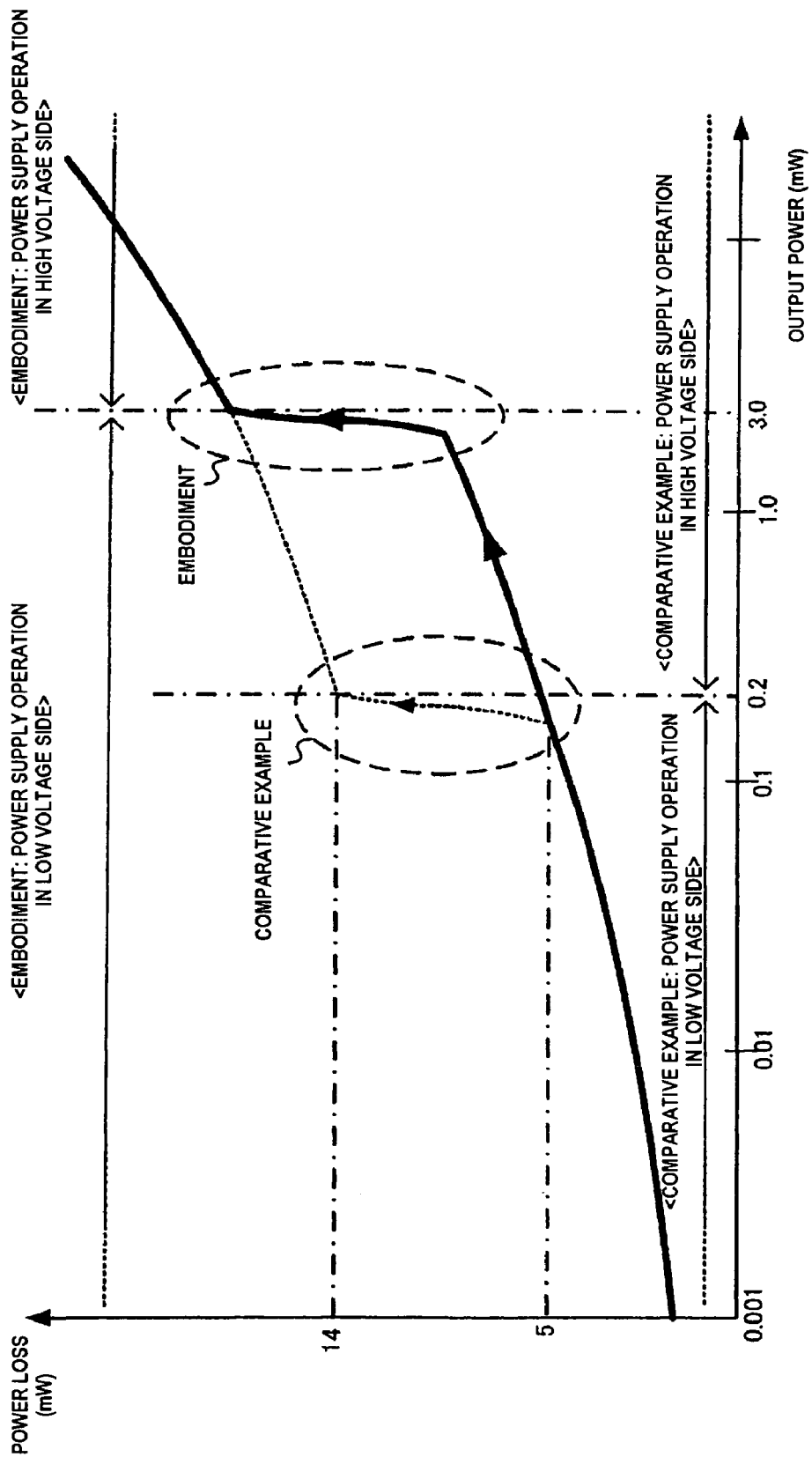

OUTPUT POWER OF 3 mW

| RI(Ω) | 16 | 16 | 16 | 32 | 32 | 32 | 16 | 16 |
|---|---|---|---|---|---|---|---|---|
| Po (mW) | 0.1 | 1 | 50 | 0.1 | 1 | 40 | 0.2 | 3 |
| Vrms (V) | 0.0400 | 0.1265 | 0.8944 | 0.0566 | 0.1789 | 1.1314 | 0.0566 | 0.2191 |
| Vp (V) | 0.0566 | 0.1789 | 1.2649 | 0.0800 | 0.2530 | 1.6000 | 0.0800 | 0.3098 |
| -VL | 0.9 | 0.9 | 1.8 | 0.9 | 0.9 | 1.8 | 0.9 | 0.9 |

INVENTION

FIRST COMPARATIVE EXAMPLE

SECOND COMPARATIVE EXAMPLE ns, the power sup-
AMPLIFYING APPARATUS

BACKGROUND OF THE INVENTION

1. Technical Field

The present invention relates to the technical field of amplifying apparatuses in which the power consumption can be reduced.

2. Background Art

WO00/72546 discloses a technique in which, in an amplifying apparatus that operates with two kinds of high and low power supply voltages from each of power supplies respectively having positive and negative polarities, the power supply voltages are controlled in accordance with the amplitude of a signal.

FIG. 11 shows an example of an amplifying apparatus for adjusting power supply voltages in accordance with the amplitude of a signal. In the example, high power supply voltages are used at ±2 V, and low power supply voltages for improving the output efficiency are used at ±1 V which are a half of the high power supply voltages of ±2 V. The configuration is employed because, owing to the property of a so-called charge pump, the two-division structure causes the circuit operation to be mostly simplified, and the output loss to be reduced.

In the conventional technique, when the low power supply voltages of ±1 V are used, the gate-source voltages Vgs of output transistors are 2 V at the maximum. In the case where the load impedance is low, i.e., for example, 8 or 16Ω and the gate-source voltage Vgs is small, it is difficult to obtain excellent linearity, and hence the saturation voltages of the output transistors become high.

Therefore, an output voltage which can be output by the low-voltage operation is smaller in amplitude than the power supply voltages of ±1 V, and there arises a technical problem in that the improvement of the power efficiency is impeded.

SUMMARY OF THE INVENTION

The invention has been conducted in view of the above-described problem of the conventional art. It is an object of the invention to provide an amplifying apparatus in which the power efficiency can be improved.

In order to solve the problem, according to the present invention, there is provided an amplifying apparatus for amplifying an input signal supplied to an input terminal and outputting an output signal from an output terminal, the amplifying apparatus comprising: a high-potential power supply line through which a high voltage is supplied; a low-potential power supply line through which a low voltage is supplied; a power supply in which one of the high voltage and the low voltage is a fixed voltage that is externally supplied, and which generates, as the other of the high voltage and the low voltage, one of a first voltage in which, based on the fixed voltage, a polarity of the fixed voltage is inverted with reference to a ground potential, and a second voltage which is closer to the ground potential than the first voltage is; an outputting section which has a p-channel transistor that is source-grounded to the high-potential power supply line and that is connected to the output terminal, and an n-channel transistor that is source-grounded to the low-potential power supply line and that is connected to the output terminal; an amplifying section which amplifies the input signal, and which supplies the amplified input signal to a gate of the p-channel transistor and a gate of the n-channel transistor; and a control unit which controls the power supply to cause the other of the high voltage and the low voltage to be switched between the first voltage and the second voltage in accordance with a signal level of the output signal.

According to the invention, the high and low voltages are supplied to the outputting section. One of the voltages is a fixed voltage, and the other voltage is switched between the first and second voltages. In the case where the amplitude of the output signal is small and the level of the signal does not become beyond a predetermined value, therefore, the fixed voltage and the second voltage are applied to the outputting section. Namely, in the case where the output signal has a small amplitude, a voltage similar to that in the case of a large amplitude is used without switching the one voltage. Consequently, the gate-source voltages of the p- and n-channel transistors can be made high, and the ON resistances of the transistors in the saturation region can be reduced. As a result, the power loss can be reduced.

Since the one voltage is set as a fixed voltage, moreover, the configuration of the power supply can be largely simplified as compared with the case where two voltages are used in place of the fixed voltage.

In the amplifying apparatus, the control unit may include: a determining section which determines whether the signal level of the output signal becomes beyond a predetermined value or not; and a generating section which generates a control signal for, based on a result of determination by the determining section, controlling the power supply so that, when the signal level of the output signal becomes beyond the predetermined value, a potential difference between the one voltage and the other voltage is in an increased state, and, when the signal level of the output signal does not become beyond the predetermined value, the potential difference between the one voltage and the other voltage is in a reduced state.

According to the invention, the other voltage is switched between the first and second voltages, and the one voltage is fixed. Therefore, the predetermined value is set in the side of the other voltage while setting the ground potential as a reference, and, depending on whether the other voltage is beyond the predetermined value or not, the switching between the first and second voltages is performed. Consequently, the power loss can be reduced without distorting the output signal, The amplifying apparatus may be configured in that, during a period to a timing when a predetermined time elapses from a timing when the signal level of the output signal is changed from a state where the signal level is beyond the predetermined value to a state where the signal level is not beyond the predetermined value, the generating section generates the control signal for instructing the potential difference between the one voltage and the other voltage to be the increased state.

According to the invention, when the level of the output signal repeatedly becomes beyond (exceeds and falls below) the predetermined value for a short time period, the other voltage can be fixed to the first voltage, and frequent voltage switching can be prevented from occurring.

The amplifying apparatus may be configured in that the power supply includes a charge pump circuit which generates the first and second voltages of the other voltage from the fixed voltage of the one voltage.

The charge pump circuit includes a plurality of capacitors and a plurality of switches, and controls the on/off operations of the switches to generate a desired voltage. According to the invention, the one voltage is a fixed voltage, and hence it is not required to control the on/off operations of the switches to switch the voltage. According to the invention, with respect to the one voltage, therefore, the power loss due to the ON resistances of the switches is not caused, and noises associated with the on/off operations of the switches are not generated.

Preferably, the charge pump circuit uses the series voltage division by the plurality of capacitors, and redistribution of charges, and generates the other voltage which has a polarity different from the one voltage with reference to the ground potential, as a voltage which is an integer fraction of the fixed voltage that is the one voltage. In this case, "integer fraction" may be determined by the ratio of the capacitances of the plurality of capacitors.

The amplifying apparatus may be configured in that, where the fixed voltage is indicated by Va, the first voltage is indicated by Vb1, and the second voltage is indicated by Vb2, Va=−2*Vb2, Va=−Vb1, and an absolute value of the second voltage is 1 V or less.

In the case where the absolute value of the second voltage is 1 V or less, if also the fixed voltage that is the one voltage is switched similarly with the other voltage, the gate-source voltages of the p- and n-channel transistors during a small-amplitude period of the output signal are 2 V at the maximum. When the load impedance is assumed to be 8 to 16Ω, a low gate-source voltage is disadvantageous. When the linearity is considered, the amplitude of the output signal which can be output during the small-amplitude period is greatly smaller than ±1 V, and the use efficiency of the power supply is not high. By contrast, in the invention, the one voltage is set as a fixed voltage, and hence the gate-source voltages of the p- and n-channel transistors during a small-amplitude period of the output signal can be 3 V at the maximum. As a result, the linearity can be improved, and the use efficiency of the power supply can be enhanced.

BRIEF DESCRIPTION OF THE DRAWINGS

In the accompanying drawings:

FIG. 6 is a graph showing qualitative and quantitative relationships between the output power and the power loss in the embodiment and the comparative example.

DETAILED DESCRIPTION OF THE
EXEMPLARY EMBODIMENTS

Figure 1:
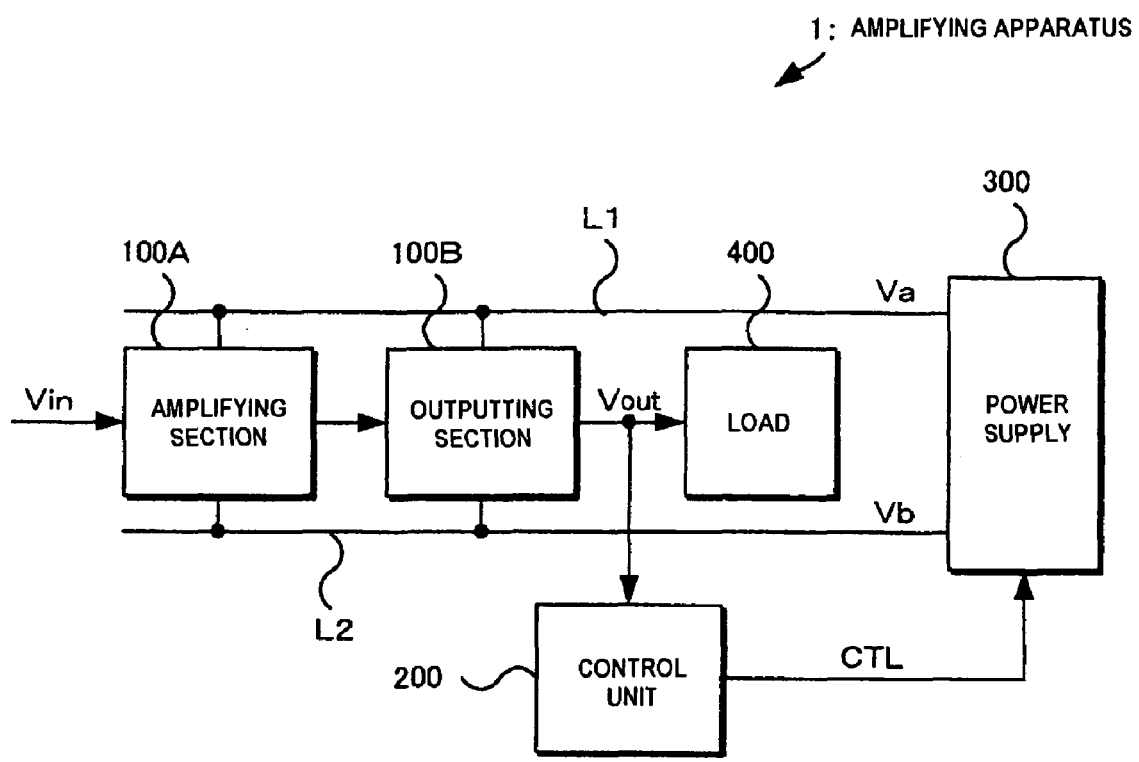
FIG. 1 is a conceptual block diagram conceptually showing the whole configuration of an amplifying apparatus 1 of an embodiment.

An embodiment of the invention will be described with reference to the drawings. FIG. 1 is a conceptual block diagram conceptually showing the whole configuration of an amplifying apparatus 1 of the embodiment, and FIG. 2 is a block diagram schematically showing the detailed configuration of the amplifying apparatus 1 of the embodiment.

As shown in FIG. 1, the amplifying apparatus 1 of the embodiment includes: an amplifying section 100A which voltage-amplifies an input signal Vin, and which outputs the amplified signal; an outputting section 100B which current-amplifies the output of the amplifying section 100A, and which supplies an output signal Vout to a load 400; a high-potential power supply line L1 through which a high voltage Va is supplied; a low-potential power supply line L2 through which a low voltage Vb is supplied; and a power supply 300 which supplies the high voltage Va and the low voltage Vb to the amplifying section 100A and the outputting section 100B. In the power supply 300, one of the high voltage Va and the low voltage Vb is set as a fixed voltage, and the other voltage is set variable. In the example, the high voltage Va is fixed, and the low voltage Vb is set variable, and selected from a first voltage Vb1 and a second voltage Vb2. A control unit 200 generates a control signal CTL instructing which one of the first voltage Vb1 and the second voltage Vb2 is to be selected. In the example, the load 400 is a speaker SP which will be described later.

Figure 2:
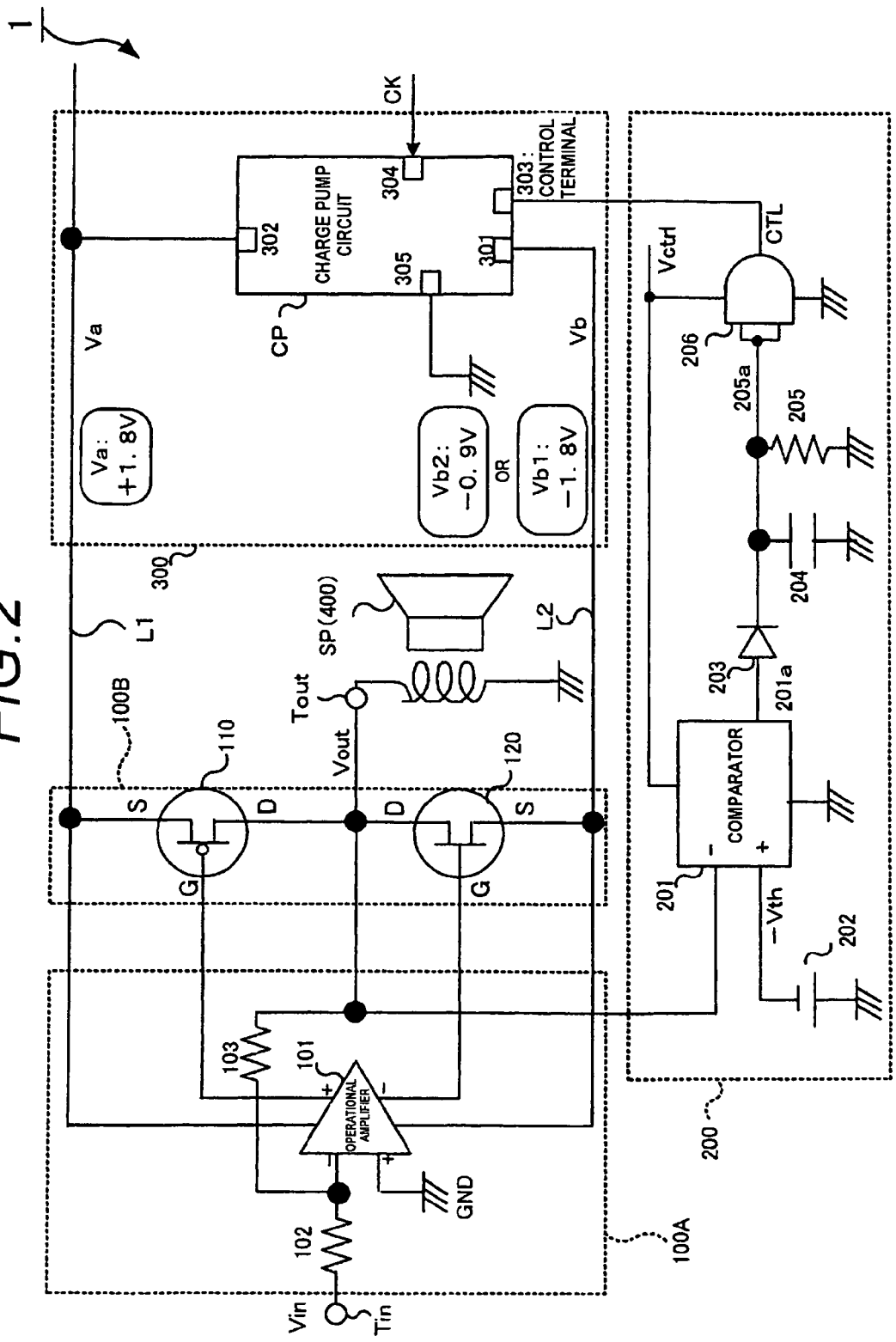
FIG. 2 is a block diagram schematically showing the detailed configuration of the amplifying apparatus 1 of the embodiment.

As shown in FIG. 2, the amplifying section 100A in the embodiment includes an operational amplifier 101 which operates with a supply of the power supply voltages or the high voltage Va and the low voltage Vb. The operational amplifier 101 is of the type of differential inputs and differential outputs. The positive input terminal of the operational amplifier 101 is grounded, and an input resistor 102 is connected between the negative input terminal of the amplifier and an input terminal Tin. A feedback resistor 103 is disposed between the output terminal Tout and the negative input terminal of the operational amplifier 101.

The outputting section 100B has a p-channel FET (Field Effect Transistor) 110 in which the source is connected to the high-potential power supply line L1, and which is connected to the output terminal Tout, and an n-channel FET 120 in which the source is connected to the low-potential power supply line L2, and which is connected to the output terminal Tout. The outputting section 100B performs a current amplification in order to drive the speaker SP functioning as the load 400. The gate of the p-channel FET 110 is connected to the positive output terminal of the operational amplifier 101, and the gate of the n-channel FET 120 is connected to the negative output terminal of the operational amplifier 101. A large current flows through the outputting section 100B, but does not flows through the amplifying section 100A.

The input signal Vin is supplied to the input terminal Tin, and the output signal Vout is output from an output terminal Tout, through the amplifying section 100A and the outputting section 100B.

The control unit 200 includes: a comparator 201 in which the output signal Vout is supplied to the negative input terminal, and a predetermined value −Vth is supplied to the positive input terminal; and a voltage source 202 which generates a voltage −Vth. The comparator 201 and the voltage source 202 function as a determining section which determines whether the level of the output signal Vout is lowered beyond the predetermined value −Vth or not. The comparator 201 outputs a signal 201a which, when the voltage of the negative input terminal is lowered beyond that of the positive input terminal, is changed from the low level to the high level, and, when the voltage of the negative input terminal is not lowered beyond that of the positive input terminal, maintains the low level.

The control unit 200 further includes a diode 203, a capacitor 204, a resistor 205, and an AND circuit 206. These circuits function as a generating section which generates the control signal CTL for controlling a charge pump circuit CP, based on the signal 201a. At the rising edge of the waveform of the signal 201a, the diode 203 is set to the ON state, and the capacitor 204 is rapidly charged. By contrast, at the falling edge of the waveform of the signal 201a, the diode 203 is set to the OFF state. At this time, charges accumulated in the capacitor 204 are discharged with the time constant which is determined by the capacitance of the capacitor 204 and the resistance of the resistor 205.

Figure 3:
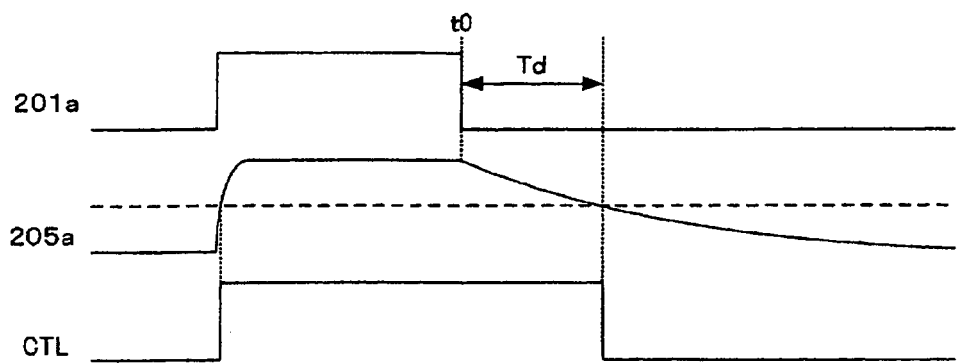
FIG. 3 is a timing chart of a control unit 200 in the embodiment.

As shown in FIG. 3, therefore, an input signal 205a of the AND circuit 206 has a waveform in which the rising edge is steep and the falling edge is gentle. In the control signal CTL, with reference to the signal 201a, therefore, the rising timing is not substantially delayed, and the falling timing is delayed by a delay time Td. The delay time Td is defined by the time constant determined by the capacitance of the capacitor 204 and the resistance of the resistor 205. If the low-level period of the signal 201a is shorter than the delay time Td, the control signal CTL maintains the high level.

Therefore, the generating section maintains the logic level of the control signal CTL during a period to that when the delay time Td elapses from the timing when the signal 201a of the comparator 201 is changed from the state where the amplitude is lower that the predetermined value −Vth to the state where the amplitude does not become beyond the predetermined value −Vth (the time t0 shown in FIG. 3).

As shown in FIG. 2, the power supply 300 in the embodiment includes the charge pump circuit CP which generates the low voltage Vb on the basis of the high voltage Va (in this example, +1.8 V) which is externally supplied. The charge pump circuit CP includes: a negative terminal 301 through which the negative voltage Vb is output; a positive terminal 302 to which the high voltage Va is externally supplied; a control terminal 303 to which the control signal CTL is supplied; a clock input terminal 304 to which a clock signal CK is supplied; and a ground terminal 305 to which the ground potential is supplied.

The charge pump circuit CP generates the first voltage Vb1 and the second voltage Vb2 as the low voltage Vb. Here, Va=−Vb1 and Va=−2Vb2. The output of the first voltage Vb1 as the low voltage Vb, or that of the second voltage Vb2 as the low voltage Vb is selected depending on the logic level of the control signal CTL.

In the following description, the instantaneous value of a signal with respect to the ground level of 0 V is called the level of the signal, and the difference between the positive peak value of a signal and the negative peak value is called the amplitude of the signal. As described above, in the case where the level of the output signal Vout is lowered beyond the predetermined value −Vth (in the case where the signal amplitude is increased beyond 2Vth), the logic level of the control signal CTL is high. In this case, the charge pump circuit CP supplies the first voltage Vb1 to the low-potential power supply line L2, as the low voltage Vb. By contrast, in the case where the signal level of the output signal Vout does not become beyond the predetermined value −Vth (in the case where the signal amplitude does not become beyond 2Vth), the logic level of the control signal CTL is low. In this case, the charge pump circuit CP supplies the second voltage Vb2 to the low-potential power supply line L2, as the low voltage Vb.

Figure 4:
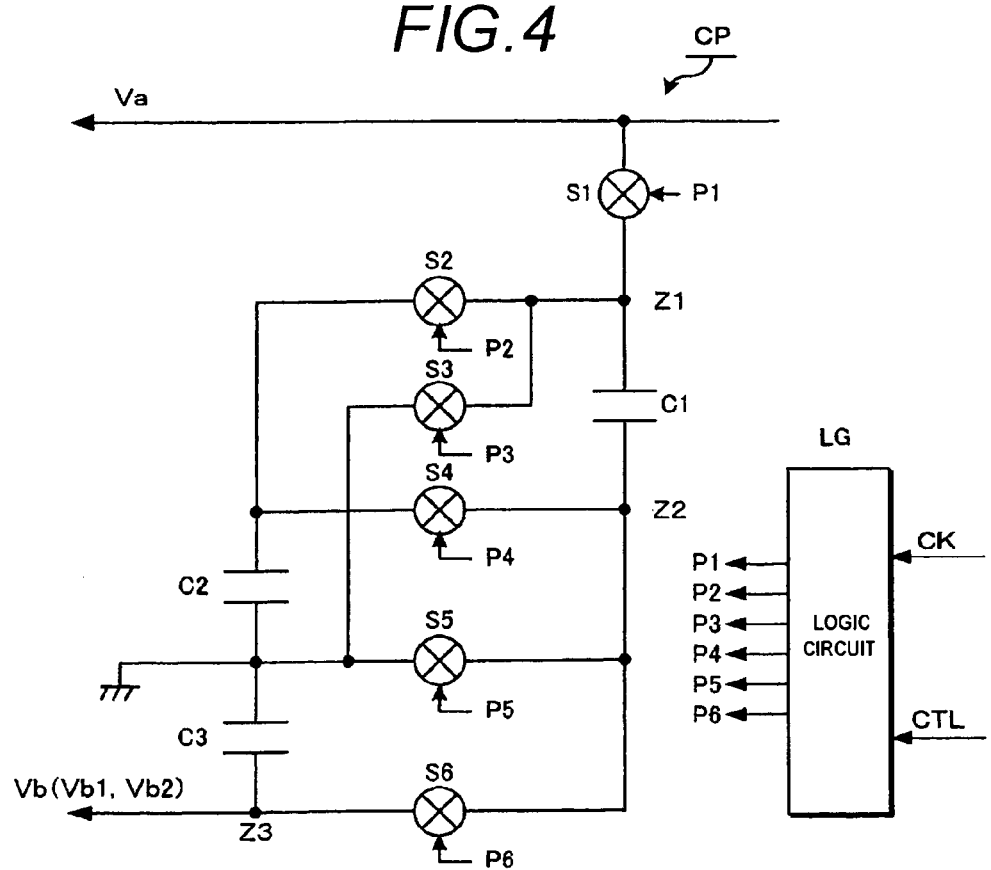
FIG. 4 is a circuit diagram of a charge pump circuit CP in the embodiment.

FIG. 4 shows main portions of the charge pump circuit CP. The charge pump circuit CP includes: capacitors C1, C2, C3; switches S1, S2, . . . , S6; and a logic circuit LG which, based on the clock signal CK and the control signal CTL, generates signals P1 to P6 for controlling the on/off operations of the switches S1, S2, . . . , S6. In this example, the capacitors C1, C2, C3 have the same capacitance Ca.

In the case where the control signal CTL is at the high level to instruct the generation of the first voltage Vb1, the logic circuit LG generates the signals P1 to P6 so that, during the high-level period of the clock signal CK, the switches S1 and S5 are set to the ON state, and the other switches S2, S3, S4, and S6 are set the OFF state, and, during the low-level period of the clock signal CK, the switches S3 and S6 are set to the ON state, and the other switches S1, S2, S4, and S5 are set the OFF state. When the switches S1 and S5 are set to the ON state, a voltage of Va is applied across the capacitor C1. In this state, when the switches S3 and S6 are set to the ON state, the node Z1 is grounded, and the voltage of the node Z2 is −Va. The node Z2 and the node Z3 are short-circuited, and hence the voltage of the node Z3 is −Va. Therefore, the first voltage Vb1 (=−Va) is output as the low voltage Vb.

Next, in the case where the control signal CTL is at the low level to instruct the generation of the second voltage Vb2, the logic circuit LG generates the signals P1 to P6 so that, during the high-level period of the clock signal CK, the switches S1 and S4 are set to the ON state, and the other switches S2, S3, S5, and S6 are set the OFF state, and, during the low-level period of the clock signal CK, the switches S2 and S5 are set to the ON state, and the other switches S1, S3, S4, and S6 are set the OFF state. When the switches S1 and S4 are set to the ON state, the high voltage Va is applied to the capacitors C1 and C2 which are connected in series. At this time, a voltage of Va/2 is applied across the capacitor C1. In this state, when the switches S3 and S6 are set to the ON state, the node Z1 is grounded, and the voltage of the node Z2 is −Va/2. The node Z2 and the node Z3 are short-circuited, and hence the voltage of the node Z3 is −Va/2. Therefore, the second voltage Vb2 (=−Va/2) is output as the low voltage Vb.

Assuming that +1.8 V which is the fixed voltage is supplied as the high voltage Va, the first voltage Vb1 is "−1.8 V", and the second voltage Vb2 is "−0.9 V".

According to the configuration, in the embodiment, when the level of the output signal Vout is lowered beyond the predetermined value (−Vth), the high voltage Va and the first voltage Vb1 are supplied to the amplifying section 100A and the outputting section 100B, and, when the level of the output signal Vout does not become beyond the predetermined value (−Vth), the high voltage Va and the second voltage Vb2 are supplied to the amplifying section 100A and the outputting section 100B.

The comparator 201 in the above-described embodiment detects only the case where the level of the output signal Vout falls below −Vth, and does not detect the case where the level of the output signal Vout exceeds +Vth. This is because, only with respect to the low voltage Vb, the power supply voltage is switched, and the high voltage Va is set as the fixed voltage. The operation of, after the level of the output signal Vout is lowered beyond the predetermined value −Vth, switching the low voltage Vb from the second voltage Vb2 to the first voltage Vb1 requires some time. Similarly, the operation of switching the low voltage Vb from the first voltage Vb1 to the second voltage Vb2 requires some time. When the switching operation from the second voltage Vb2 to the first voltage Vb1 consumes a long time, particularly, the switching cannot follow the change of the output signal Vout, and the waveform of the output signal Vout is broken.

Even when the level of the output signal Vout is changed from a low potential to a high potential with respect to −Vth, therefore, the generating section (the components 203 to 206 in FIG. 2) maintains the logic level of the control signal CTL to the high level, only for the delay time Td. More specifically, the time period from the timing when the level of the output signal Vout becomes beyond the predetermined value −Vth to that when the low voltage Vb is switched is indicated as the switching time Tsw. When Td>Tsw is set, the waveform can be prevented from being broken. In order to reduce the power consumption, preferably, the delay time Td is short as far as possible. Therefore, Td=Tsw may be set, or 2Tsw>Td>Tsw may be set.

Advantages of the embodiment will be described in detail. A first advantage is that, during the small-amplitude period of the output signal Vout, the p-channel FET 110 and the n-channel FET 120 are caused to operate in the active region where the ON resistance is low.

During the small-amplitude period where the level of the output signal Vout does not become beyond the predetermined value (−Vth), "Va−Vb2" can be applied as the gate-source voltage Vgsp of the p-channel FET 110 and the gate-source voltage Vgsn of the n-channel FET 120. In the above-described numerical example, Va−Vb2=2.7 V is obtained. By contrast, also with respect to the high voltage Va, when the power supply voltage is lowered during the small-amplitude period. For example, Va is set at 0.9 V and Vb2 is set at −0.9 V, and thus 1.8 V is applied as the voltage Vgsp and the voltage Vgsn.

When FETs having a high threshold voltage are used as the p-channel FET 110 and the n-channel FET 120, the degree of the ON resistance in the saturation region causes a problem in the power loss. In the embodiment, also during the small-amplitude period, the high voltage Va is set as a fixed voltage. As compared with the case where both the high voltage Va and the low voltage Vb are switched, therefore, the voltage Vgsp and the voltage Vgsn can be made higher, and hence the power loss due to the reduction of the ON resistance can be improved.

A second advantage is that the power loss due to the ON resistances of the switches can be reduced. In the above-described embodiment, the high voltage Va is always supplied to the amplifying section 100A and the outputting section 100B. According to the configuration, with respect to the high voltage Va, the voltage switching is unnecessary. If also the high voltage Va is switched in accordance with the amplitude of the output signal Vout, for example, the voltage of Va/2 must be generated by controlling the on/off operations of the switches S1 to S6 in the charge pump circuit CP. In this case, the power is lost by the ON resistances of the switches S1 to S6. In the embodiment, the high voltage Va is set as a fixed voltage, and hence the power loss due to the switching operation can be eliminated.

<Study of Functions and Effects of Embodiment: No. 1>

Figure 5A:
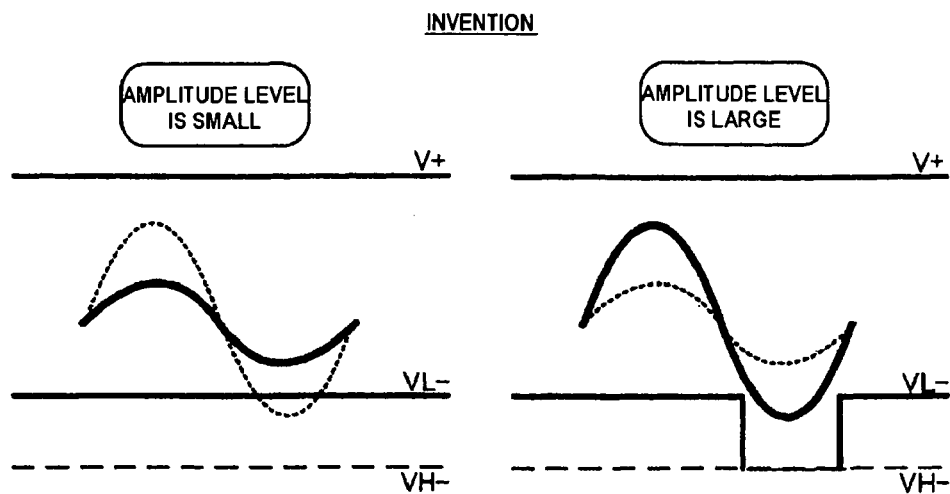
FIGS. 5A and 5B are waveform charts of output signals in the embodiment and a comparative example in the case where a low voltage is switched in accordance with the level of the amplitude of the output signal.
Figure 5B:
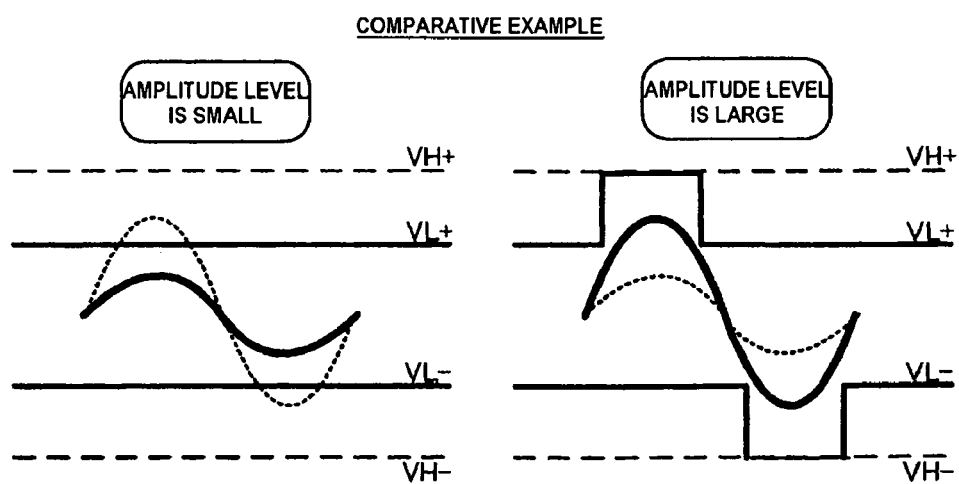

Next, the functions and effects of the amplifying apparatus of the embodiment will be studied with reference to FIGS. 5A to 8. FIG. 5A is a waveform chart of the output signal in the embodiment in the case where the low voltage Vb is switched to the first voltage Vb1 or the second voltage Vb2 in accordance with the level of the amplitude of the output signal Vout, and FIG. 5B is a waveform chart of the output signal in a comparative example in the case where the power supply voltage is switched in accordance with the level of the amplitude of the output signal Vout.

FIG. 6 is a graph showing qualitative and quantitative relationships between the output power and the power loss in the embodiment and the comparative example. The abscissa indicates the output power (mW) in each channel in stereo operation of load speakers, and the ordinate indicates the power loss (mW).

The functions and effects of the amplifying apparatus of the embodiment will be studied by comparison with a comparative example. In an amplifying apparatus of the comparative example, each of the high voltage Va and the low voltage Vb can supply two kinds of power supply voltages, and the power supply voltages are switched over in accordance with the required amplitude of the output voltage.

In the comparative example, in the case where the output signal Vout has a large amplitude, Va=+1.8 V and Vb=−1.8 V are obtained, and, in the case where the output signal Vout has a small amplitude, Va=+0.9 V and Vb=−0.9 V are obtained. By contrast, in the embodiment, in the case where the output signal Vout has a large amplitude, Va=+1.8 V and Vb=−1.8 V are obtained, and, in the case where the output signal Vout has a small amplitude, Va=+1.8 V and Vb=−0.9 V are obtained.

In the comparative example, in the case where power supply voltages of ±0.9 V are used, the gate-source voltages Vgs of the output transistors are 1.8 V at the maximum. In the case where a usual or low load impedance such as 8 to 16Ω is driven, when the gate-source voltages Vgs are low, it is difficult to obtain excellent linearity, and hence the saturation voltages of the output transistors become high. Therefore, the use efficiency of the power supply is lowered, the output voltage Vout which can be output by the low-voltage operation is smaller in amplitude than the power supply voltages of ±0.9 V, and the improvement of the power efficiency is impeded.

Research conducted by the inventors indicates the followings. The case where power supply voltages of ±0.9 V are used and a load impedance of 16Ω is driven is considered. In the comparative example, as indicated by the broken line in FIG. 6, the output transistors are in the saturation state from the vicinity where the output power exceeds 0.1 mW, and hence the power supply voltages are switched to ±1.8 V. In the comparative example, therefore, the range of the output power where the output efficiency is high is narrowed as compared with the case where, as in the embodiment, the power supply voltage is switched to −1.8 V in the vicinity of 3 mW.

In the comparative example, specifically, the switching of the power supply voltages to ±1.8 V is performed in the vicinity of the output power of 0.2 mW, the effective value of the amplitude of the output signal Vout in this case is 0.0566 Vrms, the amplitude peak is 0.08 V, and the drain-source voltages Vds of the output transistors in the switching of the power supply voltages to ±1.8 V is 0.82 V.

By contrast, according to the embodiment, the positive power supply voltage in the output transistors is fixed to +1.8 V, and the negative power supply voltage is switched to one of −1.8 V and −0.9 V in accordance with the amplitude of the output signal Vout. In the case where the amplitude of the output signal Vout is small, therefore, 2.7 V can be applied as the gate-source voltages Vgs of the output transistors.

In an IC (Integrated Circuit) configured by CMOS transistors, when the applied gate-source voltage Vgs is not higher than the threshold voltage, usually, an output transistor is not in the saturation region, and, in the saturation region where the applied gate-source voltage Vgs exceeds the threshold voltage, the region where the voltage required to be applied for causing a current to flow through the resistor Rds between the drain and the source is lowered can be used in a wider range as the applied gate driving voltage Vgs is higher. Therefore, the output power can be increased.

In the embodiment, as described above, the gate-source voltage Vgs of 2.7 V which is higher than 1.8 V in the comparative example is applied to the output transistors, and hence the higher output signal Vout can be output by driving the low-voltage power supply. As a result, in a wider range of the output power, an amplifying operation in which the output efficiency is high can be performed, and, in the amplifying apparatus, the internal loss can be remarkably reduced, so that the power efficiency can be further improved.

According to research conducted by the inventors, in the case where the saturation voltages of the drain voltages Vds in the output voltages in the embodiment are set as 0.5 V, specifically, 0.15 V which is a voltage required for determining the switching from the high-voltage power supply driving to the low-voltage power supply driving is subtracted from the saturation voltages, so that the output transistors can be driven to the peak output voltage of 0.35 V. As indicated by the solid line in FIG. 6, therefore, an amplifying operation of the output transistors in which the output efficiency is high can be performed in an output power range reaching about 3 mW. In the embodiment, as described above, the range of the output power where the amplifying operation based on the high voltage that is fixed to +1.8 V, and the low voltage that is switched to −0.9 V, i.e., where the amplifying operation of the output transistors having a high output efficiency is enabled can be set to a range reaching about 3 mW. The range can be made very wider than that in the comparative example reaching about 0.2 mW. Therefore, the power loss can be remarkably reduced as compared with the comparative example.

Figures 7, 8:
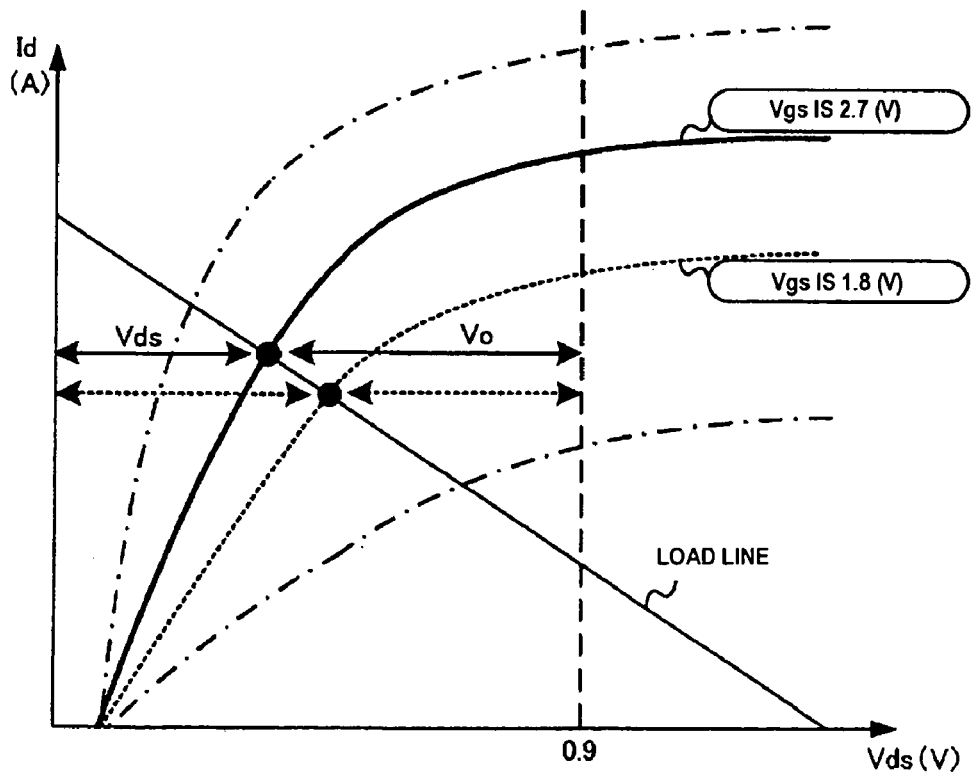
FIG. 7 is a table showing which one of a second voltage (−0.9 V) and a first voltage (−1.8 V) is selected with respect to the load resistance, the output power, the effective value of the voltage, and the peak output voltage in the embodiment.
FIG. 8 is a graph showing qualitative and quantitative relationships in the drain-source voltage Vds, the drain current Id, the gate-source voltage Vgs, and the load line in the embodiment.

FIG. 7 is a table showing which one of the second voltage Vb2 (−0.9 V) and the first voltage Vb1 (−1.8 V) is selected as the low voltage Vb with respect to the load resistance RI, the output power Po, the effective value of the voltage Vrms, and the peak output voltage Vp in the embodiment. Also at the output power of 3 mW, particularly, the second voltage Vb2 (−0.9 V) is selected. According to research conducted by the inventors, it is known that the amplifying operation of the output transistors having a high output efficiency can be performed in the range of the output power reaching about 3 mW as indicated by the solid line in FIG. 6 above.

FIG. 8 is a graph showing qualitative and quantitative relationships in the drain-source voltage Vds, the drain current Id, the gate-source voltage Vgs, and the load line in the embodiment. In FIG. 8, particularly, it is shown that, when the voltage Vgs is changed from 1.8 V to 2.7 V, the output voltage V0 is raised, and the drain-source voltage Vds is lowered. According to research conducted by the inventors, it is known that, even when the second voltage Vb2 (−0.9 V) is used as the low voltage Vb, for example, about 3 mW can be sufficiently output as the output power Po in the control range of the drain-source voltage Vds in the embodiment.

In the embodiment, as a result, an amplifying operation in which the output efficiency is high can be performed in a wider range of the output power, and, in the amplifying apparatus, the power efficiency can be further improved. In the amplifying apparatus of the power supply switching type in which the low voltages Vb of the transistors of the outputting section 100B are −1V or lower, and the amplifying section is configured by an integrated circuit, typically, the power efficiency can be further improved. In a low-output amplifying apparatus in a headphone or the like which is requested to be used for a long time period, and which is operated by a battery, particularly, the embodiment can improve the power efficiency, and therefore the embodiment is practically very useful.

<Study of Functions and Effects of Embodiment: No. 2>

Figure 9A:
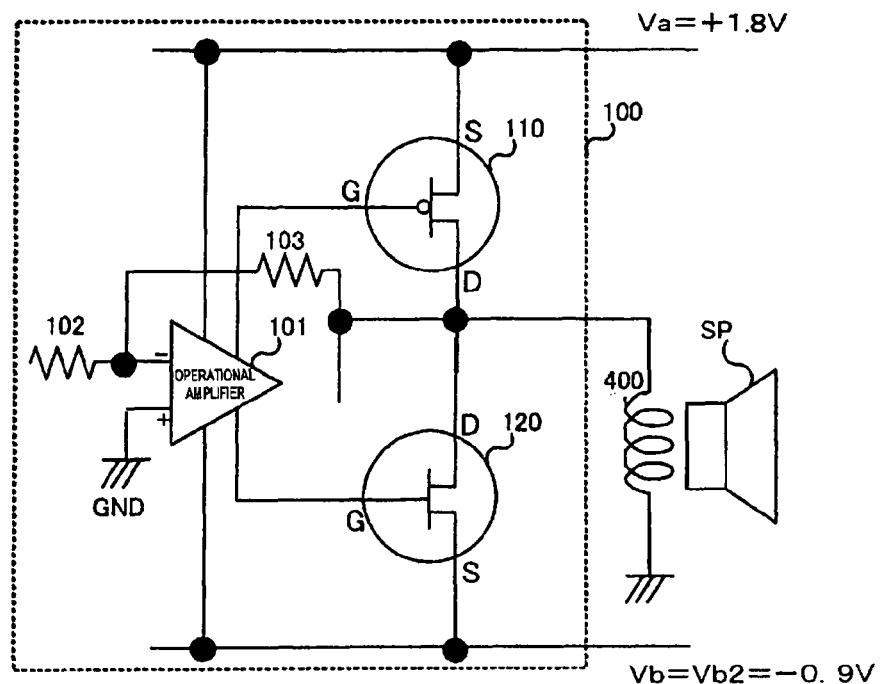
FIGS. 9A and 9B are diagrams conceptually showing the operation of the second voltage in the invention and a first comparative example.
Figure 9B:
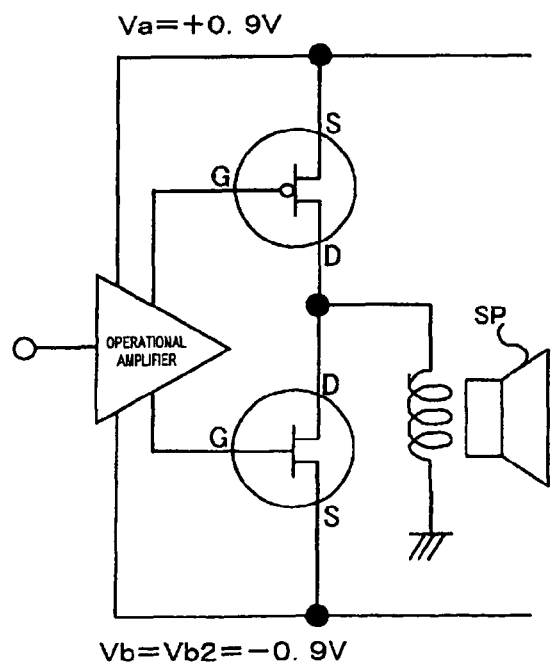
Figure 10:
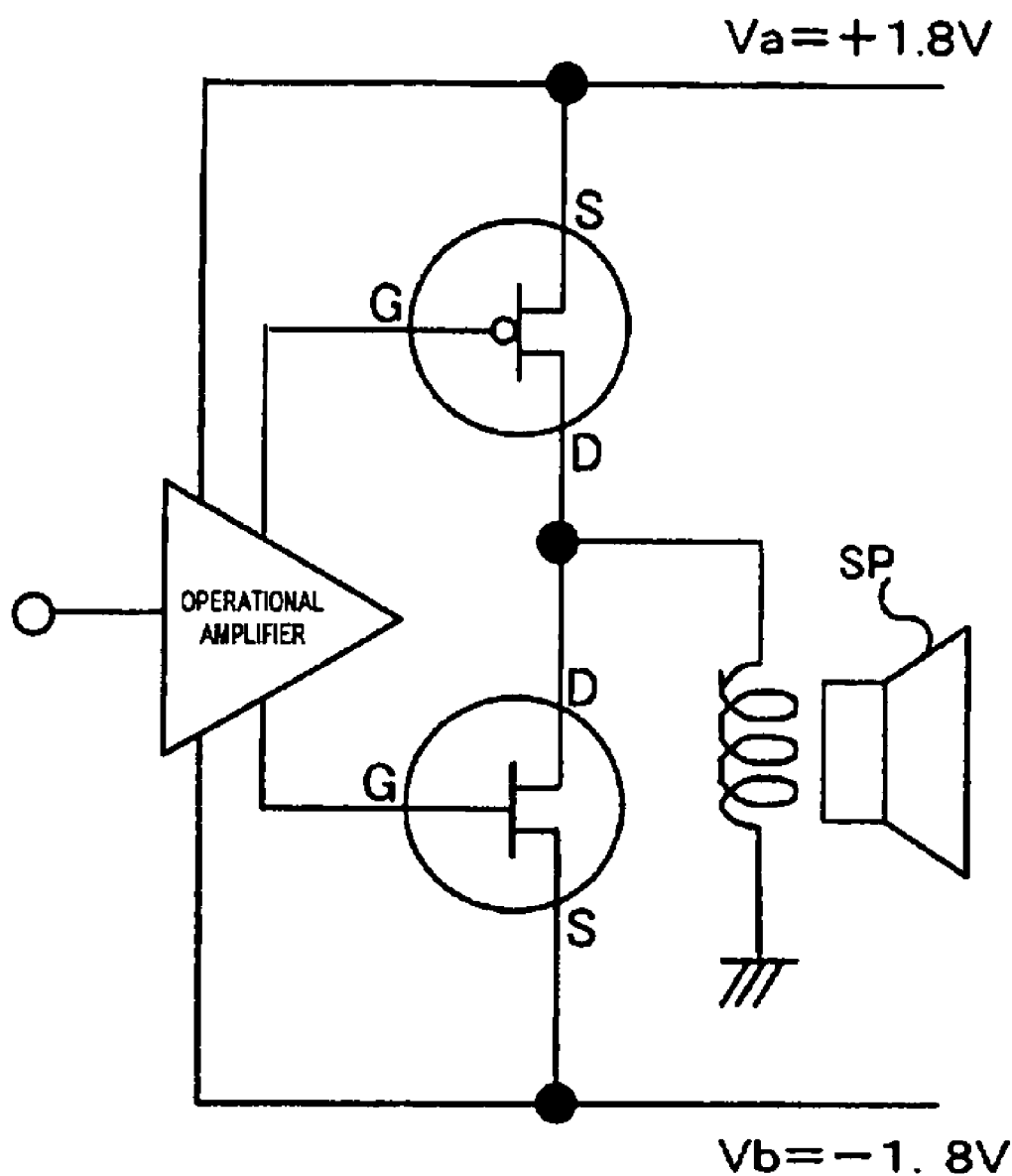
FIG. 10 is a diagram conceptually showing the operation of the second voltage in a second comparative example.
Figure 11:
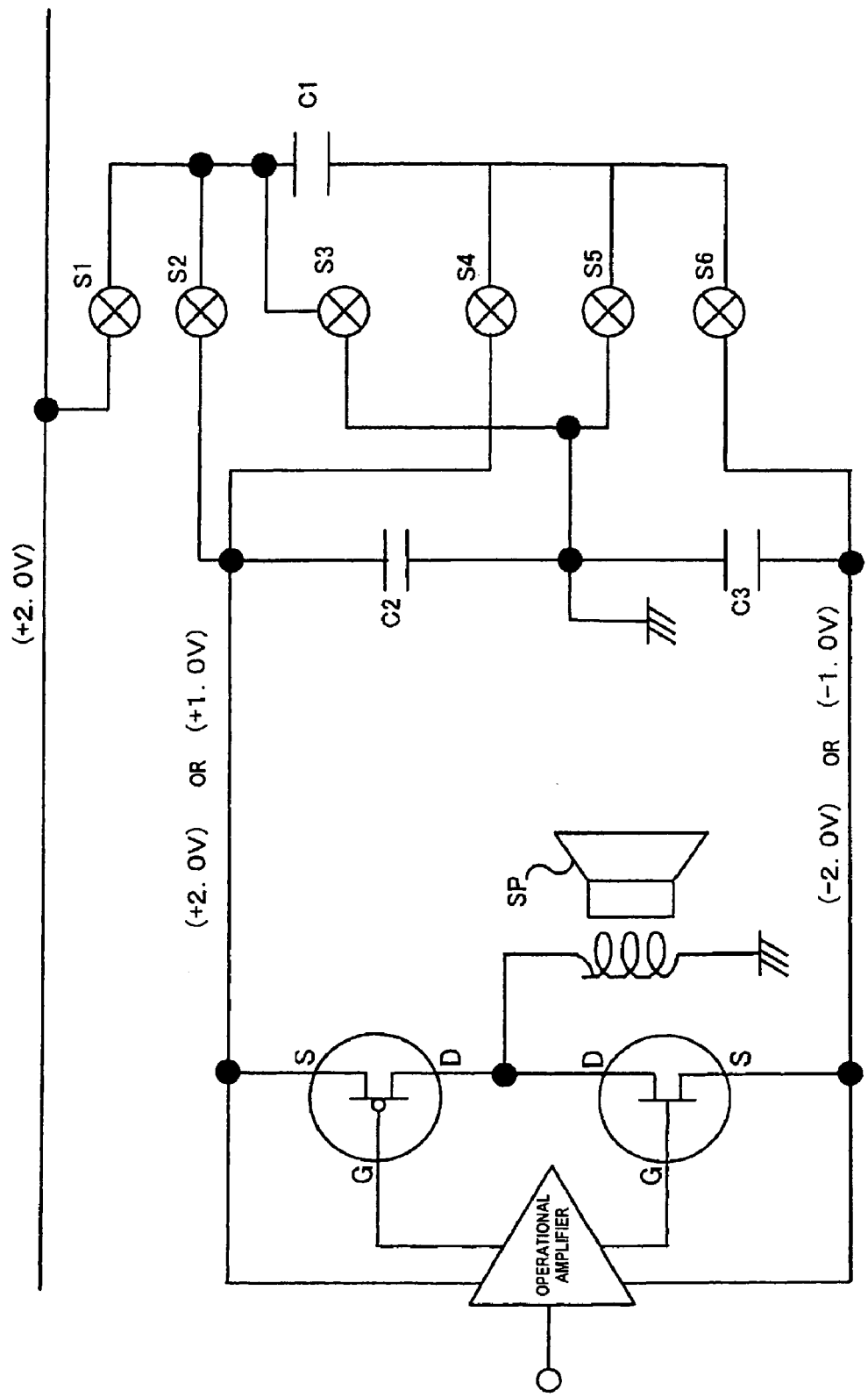
FIG. 11 is a block diagram showing the configuration of an amplifying apparatus of the conventional art.

Next, the functions and effects of the amplifying apparatus of the embodiment will be quantitatively studied with reference to FIGS. 9A to 10. FIG. 9A is a diagram conceptually showing the operation of the second voltage Vb in the embodiment, FIG. 9B is a diagram conceptually showing the operation of the second voltage Vb in a first comparative example, and FIG. 10 is a diagram conceptually showing the operation of the second voltage Vb in a second comparative example.

In the quantitative study of the functions and the effects, it is assumed that the following three conditions are satisfied. The three conditions are: (i) the power supply voltage of the high voltage Va is +1.8 V; (ii) the load impedance is 16Ω; and (iii) a sinusoidal wave of an output power of 0.1 mW is output. As SI units, "mW", "Ω", "Vrms (Voltage root mean square)", "Arms (Ampere root mean square)", "V (Voltage)", and "A (Ampere)" are used.

<Power Loss in First Comparative Example>

First, the power loss at the low voltage in the first comparative example will be quantitatively obtained with reference to FIG. 9B.

<Peak Output Voltage>

The peak output voltage in the first comparative example is indicated by following Expression (1):

$$\text{Peak output voltage} = \text{output power/load impedance} \tag{1}$$

In Expression (1), 0.1 mW is substituted for the output power, and 16Ω is substituted for the load impedance. Then, following Expression (1a) is obtained:

$$\text{Peak output voltage} = 0.1 \text{ mW}/16\Omega \tag{1a}$$

$$= 0.04 \text{ Vrms}$$

$$= 0.0566 \text{ V}$$

In Expression (1a), 0.04 Vrms corresponds to the square root of 0.0001×16, and 0.0566 V corresponds to the product of √2 (i.e., the square root) and 0.04.

<Output Current>

The output current at the peak output voltage is indicated by following Expression (2):

$$\text{Output current} = \text{peak output voltage/load impedance} \tag{2}$$

In Expression (2), 0.04 Vrms is substituted for the peak output voltage, and 16Ω is substituted for the load impedance. Then, following Expression (2a) is obtained:

$$\text{Output current} = 0.04 \text{ Vrms}/16\Omega \tag{2a}$$

$$= 0.0025 \text{ Arms}$$

In Expression (2a), 0.0025 Arms corresponds to the product of √2 (i.e., the square root) and 0.0025 A.

<Average Value of Output Current>

The average value of the output current is obtained by following Expression (3):

$$\text{Average value of output current} = 2/\pi \times 0.0025 \text{ Arms} \tag{3}$$

$$\equiv 0.00225\sqrt{2}\times 0.0025 \text{ A}$$

<Power Loss>

Here, the power loss in the amplifying apparatus of the first comparative example is indicated by PD, the power loss by the average of the output current by PDC, the output power by Po, the high power supply voltage by Va, the second voltage of the low voltage Vb by Vb2, and the average value of the output current by IDC. In this case, the power loss PD is indicated by following Expression (4):

$$PD = PDC - Po \qquad (4)$$
$$= \{(Va \times IDC/2) + (Vb \times IDC/2)\} - Po$$

In Expression (4), as shown in FIG. 9B, 0.9 V is substituted for Va, 0.0022504 is substituted for IDC, 0.9 V is substituted for Vb=Vb2, and 0.1 mW is substituted for Po. Then, following Expression (4a) is obtained:

$$PD = PDC - Po \qquad (4a)$$
$$= 2.0253 \text{ mW} - 0.1 \text{ mW}$$
$$= 1.9253 \text{ mW}$$

Therefore, about 1 mW which is the loss in the switching elements of the amplifying apparatus of the first comparative example is added to 1.9253 mW obtained by Expression (4a), with the result that the total value of the power loss in the first comparative example is calculated as about 2.925 mW.

<Power Loss in Embodiment>

Then, the power loss during a small-amplitude period in the embodiment will be quantitatively obtained with reference to FIG. 9A.

According to research conducted by the inventors, as shown in FIG. 7 above and the like, even when −0.9 V is used as the second voltage Vb2 of the low voltage, about 0.0566 Vrms can be output as the effective value Vrms of the output voltage in the control range of the drain-source voltage Vds in the embodiment. Typically, it is known that −0.9 V which is the second voltage Vb2 is a value sufficient for obtaining 0.18 V which is a peak output voltage required for outputting, for example, about 1 mW as the output power Po.

<Power Loss>

The power loss in the amplifying apparatus of the embodiment is indicated by PD. In this case, the power loss PD is indicated by Expression (4) above. In Expression (4), as shown in FIG. 9A, 1.8 V is substituted for Va, 0.0022504 is substituted for IDC, 0.9 V is substituted for Vb2, and 0.1 mW is substituted for Po. Then, following Expression (5) is obtained:

$$PD = PDCplus + PDCminus - Po \qquad (5)$$
$$\approx 2.0253 \text{ mW} + 1.0127 \text{ mW} - 0.1 \text{ mW}$$
$$\approx 2.94 \text{ mW}$$

Therefore, about 0.5 mW which is the loss in the charge pump of the amplifying apparatus of the embodiment is added to about 2.94 mW obtained by Expression (5), with the result that the total value of the power loss in the embodiment is calculated as about 3.44 mW.

In the embodiment, as compared with the first comparative example, however, the amount of the output current at the negative polarity is reduced to a half, and hence about 0.5 mW which is a half of about 1 mW that is the loss in the switching elements in the first comparative example is calculated as the loss in the charge pump in the embodiment.

<Power Loss in Second Comparative Example>

As the second comparative example, for example, the power loss in an amplifying apparatus in which positive and negative power supplies can always supply ±1.8 V as respective one kind of the power supply voltage is calculated.

When the power loss in the amplifying apparatus of the second comparative example is indicated by PD, the power loss PD is indicated by Expression (4) above.

In Expression (4), as shown in FIG. 10, 1.8 V is substituted for Va, 0.0022504 is substituted for IDC, −1.8 V is substituted for Vb, and 0.1 mW is substituted for Po. Then, following Expression (6) is obtained:

$$PD = PDCplus + PDCminus - Po \qquad (6)$$
$$\approx 2.0253 \text{ mW} + 2.0253 \text{ mW} - 0.1 \text{ mW}$$
$$\approx 3.95 \text{ mW}$$

Therefore, about 0.5 mW which is the loss in the charge pump of the amplifying apparatus, as well as in the embodiment, is added to about 3.95 mW obtained by Expression (6), with the result that the total value of the power loss in the second comparative example is calculated as about 4.45 mW.

From the above, when considered while comparing the three configurations, or the embodiment, the first comparative example, and the second comparative example with each other, about 3.44 mW which is the power loss in the embodiment is smaller by about 1 mW, i.e., about 29% (={(4.45−3.44)/3.44}) than about 4.45 mW which is the power loss in the second comparative example where switching is not performed with respect to the large- and small-amplitudes.

By contrast, about 3.44 mW which is the power loss in the embodiment is larger by about 15% (={(3.44−2.925)/3.44}) than about 2.925 mW which is the power loss in the first comparative example. In the embodiment, as described above, the gate-source voltage Vgs which can be applied to the output transistors is 2.7 V which is remarkably higher than 1.8 V in the first comparative example. This allows the threshold voltages of transistors that can be used in a generation process of an integrated circuit into which the amplifying apparatus is to be incorporated, and the degree of freedom in circuit design to be made higher than those in the first comparative example. In the embodiment, as described above, the range of the output power where the amplifying operation of the output transistors having a high output efficiency can be performed is a range reaching about 3 mW. The range is very wider than that reaching about 0.2 mW in the first comparative example. Therefore, the power loss can be remarkably reduced as compared with the comparative examples.

Roughly speaking, the increased gate-source voltages Vgs which can be applied to the output transistors of the outputting section 100B have the following advantages. First, the range of the output power where the amplifying operation of the output transistors using the power supply voltages during the small-amplitude period is enabled can be widened. Second, since the high voltage Va is a fixed voltage, the power loss is not caused, and generation of noises can be reduced. Third, the power supply voltage which is higher than the second voltage Vb2 of the low voltage Vb can be used as the high voltage Va in the outputting section 100B, and hence the degree of freedom in design in the generation process of an integrated circuit can be enhanced.

<Modifications>

The invention is not limited to the above-described embodiment, and for example may be modified in the following manners.

(1) Although, in the embodiment, the amplifying section 100A is supplied with the power supply which is identical with that supplied to the outputting section 100B, the power supply of the amplifying section 100A may be configured separately from the outputting section 100B. In the amplifying section 100A, only a current flows which is very smaller than that flowing through the outputting section 100B. Even when the amplifying section 100A is driven by a power supply voltage which is higher than that for the outputting section 100B, therefore, the power consumption is not largely increased. Consequently, it is preferable that a high power supply voltage may be supplied to the amplifying section 100A, so that the distortion characteristics of the output signal Vout can be improved.

(2) Although, in the embodiment, the high voltage Va is set as a fixed voltage, and the first voltage Vb1 and the second voltage Vb2 are switched over as the low voltage Vb, the invention is not restricted to this. It is a matter of course that the low voltage Vb may be set as a fixed voltage, and a first voltage Va1 and a second voltage Va2 may be switched over as the high voltage Va.

In the power supply 300, one of the high voltage Va and the low voltage Vb is a fixed voltage which is externally supplied, and one of the first voltage V1 in which, based on the fixed voltage, the polarity of the fixed voltage is inverted with reference to the ground potential, and the second voltage V2 which is closer to the ground potential than the first voltage may be generated as the other of the high voltage and the low voltage. In accordance with the amplitude of the output signal Vout, the control unit 200 may control so that the other of the high voltage Va and the low voltage Vb is switched between the first voltage V1 and the second voltage V2.

The invention can be used in an amplifying apparatus.

What is claimed is:

1. An amplifying apparatus for amplifying an input signal supplied to an input terminal and outputting an output signal from an output terminal, the amplifying apparatus comprising:
    a high-potential power supply line through which a high voltage is supplied;
    a low-potential power supply line through which a low voltage is supplied;
    a power supply in which one of the high voltage and the low voltage is a fixed voltage that is externally supplied, and which generates, as the other of the high voltage and the low voltage, one of a first voltage in which, based on the fixed voltage, a polarity of the fixed voltage is inverted with reference to a ground potential, and a second voltage which is closer to the ground potential than the first voltage is;
    an outputting section which has a p-channel transistor that is source-grounded to the high-potential power supply line and that is connected to the output terminal, and an n-channel transistor that is source-grounded to the low-potential power supply line and that is connected to the output terminal;
    an amplifying section which amplifies the input signal, and which supplies the amplified input signal to a gate of the p-channel transistor and a gate of the n-channel transistor; and
    a control unit which controls the power supply to cause the other of the high voltage and the low voltage to be switched between the first voltage and the second voltage in accordance with a signal level of the output signal.

2. The amplifying apparatus according to claim 1, wherein the control unit includes:
    a determining section which determines whether the signal level of the output signal becomes beyond a predetermined value or not; and
    a generating section which generates a control signal for, based on a result of determination by the determining section, controlling the power supply so that, when the signal level of the output signal becomes beyond the predetermined value, a potential difference between the one voltage and the other voltage is in an increased state, and, when the signal level of the output signal does not become beyond the predetermined value, the potential difference between the one voltage and the other voltage is in a reduced state.

3. The amplifying apparatus according to claim 2, wherein, during a period to a timing when a predetermined time elapses from a timing when the signal level of the output signal is changed from a state where the signal level is beyond the predetermined value to a state where the signal level is not beyond the predetermined value, the generating section generates the control signal for instructing the potential difference between the one voltage and the other voltage to be the increased state.

4. The amplifying apparatus according to claim 1, wherein the power supply includes a charge pump circuit which generates the first and second voltages of the other voltage from the fixed voltage of the one voltage.

5. The amplifying apparatus according to claim 4, wherein, where the fixed voltage is indicated by Va, the first voltage is indicated by Vb1, and the second voltage is indicated by Vb2, $Va=-2*Vb2$, $Va=-Vb1$, and an absolute value of the second voltage is 1 V or less.

* * * * *